(12) United States Patent
Silveston-Keith (10) Patent No.: US 7,615,704 B2
(45) Date of Patent: Nov. 10, 2009

(54) MULTIPLE DIGITAL PRINTING TECHNIQUES FOR FABRICATING PRINTED CIRCUITS

(75) Inventor: Rebecca Silveston-Keith, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 588 days.

(21) Appl. No.: 11/305,828

(22) Filed: Dec. 16, 2005

(65) Prior Publication Data

US 2006/0160432 A1 Jul. 20, 2006

Related U.S. Application Data

(60) Provisional application No. 60/636,631, filed on Dec. 16, 2004.

(51) Int. Cl.
*H05K 1/00* (2006.01)
(52) U.S. Cl. ............... 174/250; 174/258; 343/700 MS; 438/125
(58) Field of Classification Search .......... 343/700 MS; 174/250, 258; 438/125
See application file for complete search history.

(56) References Cited

U.S. PATENT DOCUMENTS

| | | | |
|---|---|---|---|
| 5,959,256 A * | 9/1999 | Saida et al. ................. 174/258 |
| 6,156,419 A | 12/2000 | Brugger et al. | |
| 6,262,692 B1 | 7/2001 | Babb | |
| 6,429,831 B2 | 8/2002 | Babb | |
| 6,440,625 B1 * | 8/2002 | Berlin .......................... 430/55 |
| 6,569,508 B2 | 5/2003 | Babb et al. | |
| 6,709,962 B2 | 3/2004 | Berg | |
| 6,817,530 B2 | 11/2004 | Labrec et al. | |
| 6,819,244 B2 | 11/2004 | Dukler et al. | |
| 6,819,783 B2 | 11/2004 | Goldberg et al. | |
| 6,824,857 B2 | 11/2004 | Lochun et al. | |
| 6,842,148 B2 | 1/2005 | Hendler et al. | |
| 7,080,448 B2 * | 7/2006 | Wu et al. ....................... 29/852 |
| 7,115,818 B2 * | 10/2006 | Kusano et al. ............... 174/254 |

OTHER PUBLICATIONS http://www.bakerhughes.com/bakerpetrolite/polymers/alcohol_ethoxylates.htm.
http://www.bakerhughes.com/bakerpetrolite/polymers/linear_primary_alcohols.htm.
http://www.bakerhughes.com/bakerpetrolite/polymers/olefin_maleic_polymers.htm.
http://www.pictorico.com/category/6-Photo-Glossy-Paper.htm.

* cited by examiner

*Primary Examiner*—Tan Ho
(74) *Attorney, Agent, or Firm*—Taft, Stettinius & Hollister (57) ABSTRACT

Methods of fabricating a printed circuit and printed circuits, including a method comprising: (a) depositing a conductive material to form a first conductive pathway upon a substrate; (b) depositing a dielectric material directly over at least a first portion of the conductive pathway utilizing an electrophotographic process; and (c) depositing a conductive material over at least a portion of the dielectric material to form a second conductive pathway, where the second conductive pathway is in electrical communication with the first conductive pathway.

16 Claims, 9 Drawing Sheets

MULTIPLE DIGITAL PRINTING TECHNIQUES FOR FABRICATING PRINTED CIRCUITS

CROSS-REFERENCE TO RELATED APPLICATIONS

The present application claims the benefit of U.S. Provisional Patent Application Ser. No. 60/636,631, entitled "MULTIPLE PRINTING TECHNIQUES FOR FABRICATING PRINTED CIRCUITS, filed Dec. 16, 2004, the disclosure of which is hereby incorporated by reference.

RELATED ART

Field of the Invention

The present invention is directed to devices and methods of fabricating devices utilizing deposition printers and, more specifically, to printed circuits and methods of fabricating such printed circuits. In addition, the present invention involves utilization of deposition printers to fabricate RFID devices, such as RFID antennas.

SUMMARY

It is a first aspect of the present invention to provide a method of fabricating a printed circuit comprising: (a) depositing a first conductive material to form a first conductive pathway upon a substrate; (b) depositing a dielectric material directly over at least a first portion of the conductive pathway utilizing an electrophotographic process; and (d) depositing a second conductive material over at least a portion of the dielectric material to form a second conductive pathway, where the second conductive pathway is in electrical communication with the first conductive pathway.

It is a second aspect of the present invention to provide a method of fabricating a printed circuit comprising: (a) depositing a conductive material to form a first conductive pathway upon a substrate; (b) depositing a dielectric material in contact with at least a first portion of the first conductive pathway; and (c) depositing a conductive material directly over the dielectric material to form a second conductive pathway in a stacked structure, where the act of depositing a dielectric material in contact with at least a first portion of the first conductive pathway includes the act of vertically electrically insulating the first portion of the conductive pathway from the second conductive pathway.

It is a third aspect of the present invention to provide an RFID antenna, comprising: (a) a first conductive material forming a first conductive pathway; (b) a dielectric material directly contacting a portion of the first conductive pathway and likewise leaving exposed a portion of the first conductive pathway; and (c) a second conductive material directly in concurrent contact with the first conductive material and the dielectric material, where a majority of the second conductive material is vertically elevated and physically separated from the majority of the first conductive material.

DETAILED DESCRIPTION

The exemplary embodiments of the present invention are described and illustrated below to encompass methods of fabricating printed circuits as well as the resulting products of such methods. Of course, it will be apparent to those of ordinary skill in the art that the preferred embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention.

Figure 1:
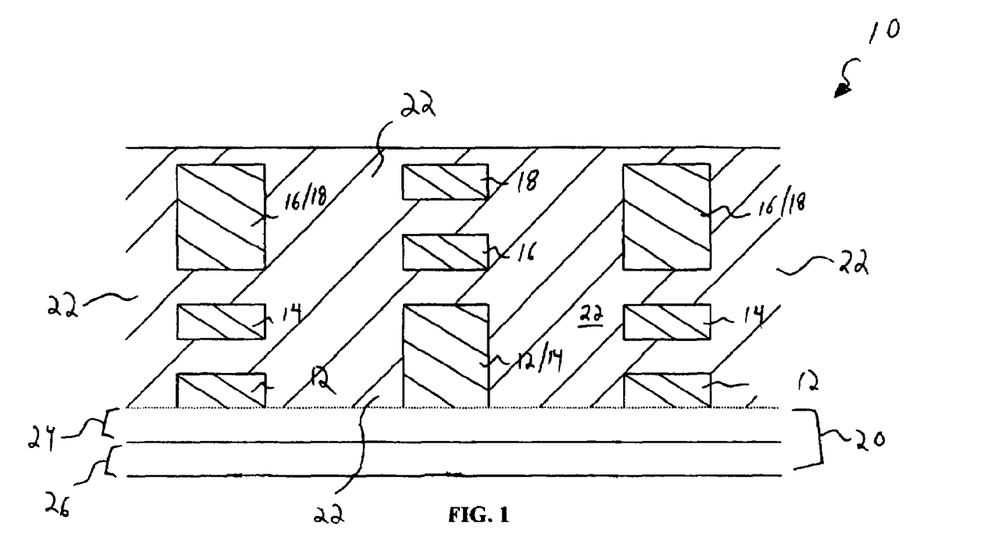
FIG. 1 is a cross-sectional view of a segment of an exemplary printed circuit in accordance with the present invention.

Referencing FIG. 1, a first exemplary circuit 10 of the present invention includes multiple conductive pathways 12, 14, 16, 18 deposited on a substrate 20 in a tiered fashion, which in exemplary form comprises an antenna for an RFID tag. Dielectric material 22 interposes the conductive pathways 12, 14, 16, 18 to electrically isolate certain aspects of the conductive paths from one another. The first exemplary circuit 10 is fabricated by depositing conductive and dielectric inks and toners to form the exemplary circuit 10 upon the substrate 20. As will be discussed in more detail below, exemplary processes for fabricating the circuit 10 may include utilizing at least one inkjet process (e.g., using an inkjet printer) and/or at least one electrophotographic process (e.g., using a laser printer).

Those skilled in the art are aware that inkjet printing apparatus, such as inkjet printers, utilize a fluid-based ink comprising pigments and dyes disbursed in a carrier fluid. Some inkjet printers utilize thermal inkjet technology having thermal resistors that are selectively energized and are operative to vaporize a portion of the carrier fluid approximate a nozzle to create a bubble that forces a droplet of ink from the nozzle. This technique is repeated numerous times a second, along with repositioning of the nozzles, to deposit droplets of ink upon a substrate in a predetermined pattern. As the carrier fluid evaporates, the pigment is left behind on the surface of the substrate to form an image, while the dye tends to penetrate into the surface. Exemplary images include, without limitation, alpha-numeric characters, diagrams, bar codes, and fanciful pictures. Another subset of inkjet printers utilizes piezoelectric actuators to expel droplets of ink from inkjet nozzles. The piezoelectric actuators are subjected to an applied voltage causing the actuators to deform and physically push the ink from the nozzle analogous to a paddle in water. It is to be understood, however, that when the exemplary embodiments of the present invention refer to inkjet printers, the invention is not limited to printers utilizing piezoelectric actuators or thermal resistors for depositing droplets of ink onto a substrate. Moreover, the inkjet printers referenced in the explanation of the instant invention utilize inks comprising a carrier fluid and a particulate component having conductive or insulative properties depending upon the intended application.

Those skilled in the art are also aware that an electrophotographic process, such as used in laser printers, utilize toner to form images upon a substrate. More specifically, the electrophotographic process utilizes the common principal that oppositely charged materials attract one another, and that more highly/densely charged materials will attract oppositely charged materials to a greater extent than lower/less densely charged materials. In a very simplistic explanation of how a typical laser printer operates, for example, a revolving drum is charged, opposite to that of the toner, to form a mirror image of the eventual image to be printed upon the substrate. As the drum is rotated, the opposite charge of the image portions of the drum attract toner particles. These toner particles are then in the form of a mirror image on the drum and are brought into contact with a more highly charged substrate so that the toner is attracted to the substrate. Thus, the toner leaves the drum and becomes deposited onto the substrate to form the image. Optionally, the toner may be heated or fused to bind the toner to the substrate using a pair of heated rollers through which the substrate is compressed and conveyed. It is to be understood, however, that when the exemplary embodiments of the present invention refer to laser printers, the invention is not limited to printers utilizing a revolving drum for depositing charged toner onto a substrate, nor necessarily requires printers incorporating fusers. Moreover, the laser printers referenced in the explanation of the instant invention utilize toners comprising waxes and particulate components, where the particulate components have conductive or insulative properties depending upon the intended application.

In this first exemplary circuit 10, the conductive pathways 12, 14, 16, 18 are formed using an inkjet ink that includes conductive particles distributed throughout the carrier fluid. The conductive particles comprise one or more materials operative to conduct electrical current; i.e., materials having a relatively low resistance to the flow of electric current. Thus, the conductive particles may be chosen from a plethora of conductive materials, where the conductive material is reduced to particles having sizes less than the inkjet nozzle cross-sectional area. Otherwise, the particles will be too large and plug the plumbing of the inkjet conduits feeding the nozzles. The carrier fluid, in which the conductive particles are disbursed, may be organic or inorganic, polar or nonpolar, and, for purposes of explanation only, is a water-based fluid in the exemplary embodiments. However, solvent based inks may also be used with inkjet printers, such as those equipped with piezoelectric actuators. Exemplary conductive inks for use with the present invention include silver ink, copper ink, and gold inks available from Nippon Kayaku America Inc., and Cima NanoTech, Inc. (www.cimananotech.com). For purposes of explanation, conductive particles will generally have particle sizes ranging between five and two hundred nanometers. Nevertheless, the particle size must be compatible with the dimensions of the nozzle openings of the inkjet printer to ensure that large particles do not clog the nozzles. In other words, larger particles can be printed with larger opening nozzles, where as small particles can be printed using larger opening nozzles of smaller opening nozzles.

Figure 2:
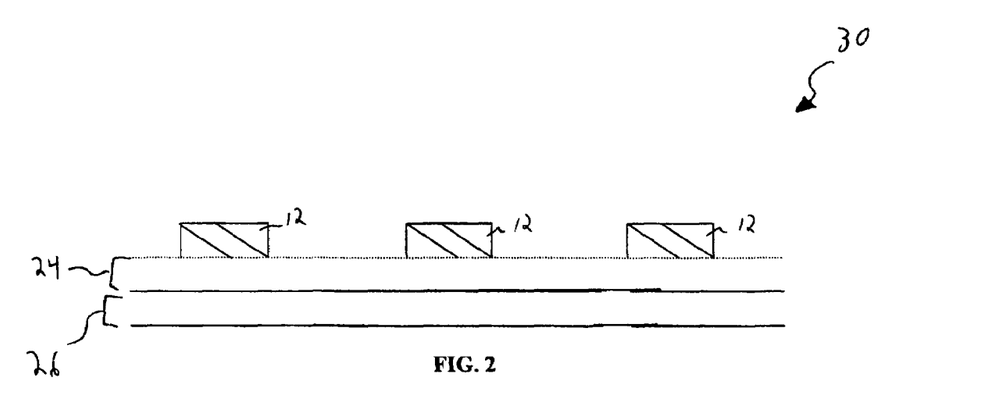
FIG. 2 is a cross-sectional view of a segment of a first exemplary printed circuit intermediate in accordance with the present invention.

Referring to FIG. 2, a first exemplary intermediate 30 of the exemplary circuit 10 includes the first conductive pathway 12 deposited upon the substrate 20, which may comprise, without limitation, silicon-based, polymer-based, lingo-cellulose-based, and/or glass-based materials. For purposes of explanation only, the substrate 20 discussed in this exemplary embodiment includes highly uniform ceramic particles 24 arranged on the surface of a cellular-based backer 26. Exemplary substrates 20 having a dual layer structure include, without limitation, premium photo glossy paper commercially available from Pictorico Corporation, www.pictorico.com. It is to be understood that the substrate 20 may be temporary and thereby removed from the dielectric material and conductive materials subsequent to the deposition process, and does not necessarily comprise a component of the exemplary circuit 10.

An inkjet printer (not shown) can be utilized to deposit droplets of a conductive ink onto the substrate 20 in a pattern to create the first conductive pathway 12. The pattern derives from the orientation established by a programmer and automatically rendered by a computer software package after the programmer inputs a series of design rules providing a metes and bounds for the layout of the circuit 10. The computer software package compiles an electronic design file with instructions specific to a printer engine, where the instructions characterize the location (in two dimensions) upon the substrate where conductive ink should be deposited and the frequency with which conductive ink should be deposited at a given location (thickness; i.e., a third dimension) to eventually form the conductive pathways 12, 14, 16, 18. Likewise, the electronic design file may also include instructions regarding the location (in two dimensions) upon the substrate where dielectric and/or ink receiving layer material should be deposited and the frequency with which the dielectric and/or ink receiving layer material should be deposited at a given location (thickness; i.e., a third dimension) to isolate the conductive pathways and possibly provide vias to receive the conductive ink and also to provide porosity or channels to divert the carrier fluid in subsequent depositions of conductive ink if necessary. When multiple printers are utilized to deposit the conductive ink, the dielectric material, the ink receiving layer and the "electronic design file" may actually comprise two or more design files separate and distinct from one anther with instructions specifically designed for each printer utilized. Those of ordinary skill should be familiar with the computer software packages and the general concept of design rules sufficient to program and bring about an electronic representation of an exemplary printed circuit 10 by following the teachings of the present invention.

In accordance with the instructions embedded in the electronic design file, the printer engine of the inkjet printer orients at least one of the substrate 20 and the printer nozzles to initiate the deposition sequence. Once the printer nozzles are oriented with respect to the substrate 20 at a starting location, the deposition instructions are carried out by the printer to selectively deposit droplets of conductive ink onto the substrate, thereby forming the first conductive pathway 12 on the top of the substrate 20.

The highly uniform nature of the ceramic particles 24 comprising the first layer of the substrate 20 provide relatively uniform channels 28 or pore volume between the ceramic particles for the diversion of the carrier fluid from the conductive particles. As droplets of conductive ink are deposited onto the surface of the ceramic particles, a portion of the carrier fluid from each droplet is immediately drawn into one or more of the channels 28 or pores. This diversion of the carrier fluid acts to decrease the surface area of the substrate 20 that the droplet covers. This substrate and its associated diversion layer of silica 24 is in contrast to a substrate where the bulk of the fluid is retained on the surface of the substrate for a significant period of time, which allows the droplet to spread outward after initially contacting the substrate and further cover a greater surface area with a droplet having an analogous volume. It should be noted that the silica can be supplemented or replaced by alumina.

Figure 3:
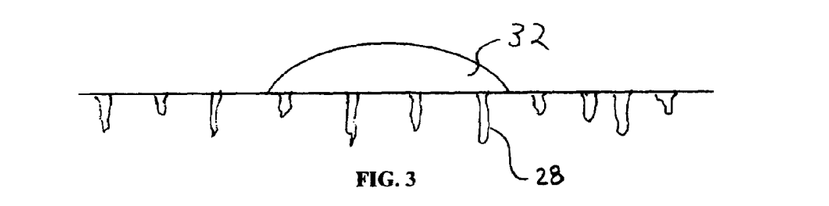
FIG. 3 is a cross-sectional view of an ink droplet deposited on a substrate having microchannels.
Figure 4:
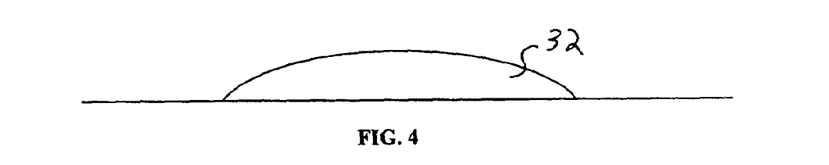
FIG. 4 is a cross-sectional view of an ink droplet deposited on a substrate lacking microchannels.

FIGS. 3 and 4 show the difference in surface area covered by a droplet 32 (i.e., footprint) when the substrate includes channels 28 (see FIG. 3) or is porous, and when the substrate includes no channels or is impervious (see FIG. 4). The cross-sectional area of the bulk of the channels 28 or pores is too small, however, to accommodate throughput of a majority of the conductive particles of the ink so that the conductive particles remain substantially on the surface of the ceramic particles 24. Moreover, in an exemplary embodiment, the channel/pore volume and distribution should allow for capillary action to divert the carrier fluid quickly. Therefore, the channels 28 or pores in communication with the surface of the first layer 24 of the substrate 20 should facilitate more precise placement of the conductive particles onto the surface by reducing migration of the conductive particles that might otherwise be distributed across a wider area, as shown in FIG. 4. It should be noted that the conductive particles themselves may stack upon one another in an arrangement that provides gaps or crevices therebetween as further conductive ink is deposited in a particular location to allow the carrier fluid to flow between the conductive particles and eventually down into the channels 28 on the first layer of the substrate 20.

A vacuum may be applied to the substrate 20 during and/or after droplet deposition to further draw the carrier fluid away from the conductive particles. In this manner, the lower pressure area created by the vacuum draws the carrier fluid downward and into the channels 28 at a faster rate than by mere gravitational feed teamed with capillary actions. The vacuum also helps reduce the footprint of the ink droplet to allow a greater density of conductive particles to be deposited at a given location.

It is also within the scope of the invention that the substrate 20, having the conductive ink deposited thereon, be placed in an elevated temperature environment to hasten evaporation of the carrier fluid. This technique may be used independent of the vacuum discussed above or in combination with the vacuum. An exemplary elevated temperature environment can be brought about by placing the substrate 20 in proximity to a heat or light source such as, without limitation, a furnace, an oven, or a kiln to evaporate the carrier fluid using at least one of conduction, convection, and radiation. The volume of carrier fluid on the surface of the substrate along with the volume of carrier fluid within the channels 28 or pores directly impacts the footprint of successive droplets of conductive ink. Therefore, when building the conductive particles upon one another, the rate by which the carrier fluid is drawn off or evaporated has a direct impact on the time between successive droplets in a single location. In this manner, the elevated temperature environment may be useful to decrease the time between successive droplets in a single location, thereby increasing the production rate of printed circuits 10.

It is to be understood that a number of practical considerations may impact the number and size of droplets of conductive ink deposited to form the first conductive pathway 12. Examples of such considerations include, without limitation, the dimensions of the conductive paths, the number of nozzles associated with the inkjet printer that are operative to eject the conductive ink, the conductive ink utilized, the substrate chosen, the capacity of the subsequent ink receiving layers to receive carrier fluid if it is needed and environmental conditions such as the ambient temperature and the substrate temperature. As will be apparent hereafter, these exemplary considerations may also affect the deposition of conductive material comprising the second 14, third 16, and fourth 18 conductive pathways.

Figure 5:
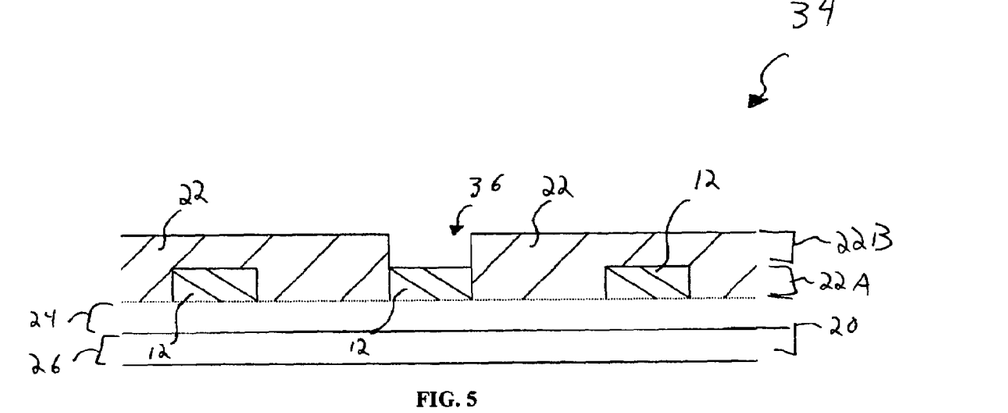
FIG. 5 is a cross-sectional view of a segment of a second exemplary printed circuit intermediate in accordance with the present invention.

Referring to FIG. 5, a second exemplary intermediate 34 of the present invention incorporates the first exemplary intermediate 30 and further includes dielectric material 22 deposited over at least a portion of the first conductive path 12. A Lexmark® C750 laser printer (not shown) programmed with the dielectric deposition instructions of the electronic design file can be utilized to deposit the dielectric material 22 onto the substrate 20. A portion of the dielectric material 22 isolates adjacent segments of the first conductive pathway 12 from one another, but leaves exposed a segment of the first conductive pathway 12 to be electrically joined to a successive conductive pathway; in this case, the second conductive pathway 14 (see FIG. 6).

Subsequent to dielectric material 22 deposition, the dielectric material 22 may be fused at 140-185° C. utilizing the C750 fuser or analogous fuser of a comparable laser printer. It is important to note that if the dielectric material 22 is not fused, gaps may be present between the dielectric particles that may work to draw off the carrier fluid from subsequently deposited conductive ink. In this manner, it may be advantageous to deposit the dielectric material 22 in separate layers, where a first layer 22A isolates the first conductive pathways 12 and the second layer 22B defines the vias 36. Thus, the first layer of dielectric material 22A may be fused to more densely pack the dielectric material to ensure electrical isolation of those portions of the first conductive pathway 12 covered, and afterwards deposit the second layer of dielectric material 22B having gaps that are operative to draw off the carrier fluid of any subsequently deposited conductive ink. The dielectric material 22B can also be thought of as forming the ink receiving layer if a subsequent ink jet ink is used that requires channels to receive the carrier fluid.

In general, the dielectric material 22 may comprise a single layer with more or less uniform chemistry or comprise multiple layers having differing chemistries. For example, the chemistry of the layers of dielectric material may be altered to improve the wettability and adhesion of the ink, whether the carrier fluid is polar or nonpolar, but still allow good adhesion between successive layers of dielectric material, even where the dielectric material have differing chemistries. By way of example, and not by way of limitation, the first dielectric material 22A is deposited to isolate the segments of the first conductive path 12 from one another may be strongly hydrophobic, whereas the dielectric material 22B that comes into contact with conductive ink may be formulated to have increased hydrophilicity and preferred interaction characteristics to allow greater density and more precise deposition of the conductive ink. As discussed above, the dielectric material 22, in addition to isolating those aspects of the first conductive path 12 not intended to be vertically interconnected with subsequent conductive path(s), defines vias 36 to facilitate interconnection 38 formation (see FIG. 6).

While the second exemplary intermediate 34 has been described using a two-step dielectric material deposition process, it is within the scope of the invention to sequentially deposit a single dielectric layer and ink receiving layer or concurrently deposit different dielectric material layers using one or more printers, each having one or more toner bays, followed by subsequently depositing the ink receiving layer from one or more printers each having one or more toner bays. For example, utilizing a color laser printer having toners bays adapted to house multiple toner cartridges, an isolating layer of dielectric material 22A may be deposited utilizing cyan, yellow, and magenta toner bays, while a conductive ink receiving layer 22B may be deposited utilizing the black toner bay. Further, the cyan, yellow, magenta, and black toner bays may all be utilized or utilized in combination to deposit a single layer of dielectric material. Alternatively the cyan cartridge may be used for the conductive layer, the yellow for the dielectric layer and the magenta and black for the ink receiving layer. The ink receiving layer would primarily be necessary if the conductive material was part of a liquid ink as opposed to a dry toner, for example if the ink contained a carrier fluid, such as water or alcohol for thermal ink jet printers. Such an ink receiving layer would not be necessary if the conductive ink was printed from a laser printer. In other words it is possible to print one or more layers using one or more printers of one or more technologies, laser followed by ink jet followed by laser. In this way the advantages of the printing technique can be used to optimize the layer to be printed. Those of ordinary skill will readily understand the obvious variances that may be harnessed utilizing a combination of one or more laser printers and/or one or more ink jet printers. In sum, each cartridge bay may include toners having the same or unique electrical and physical properties to tailor the layering of the dielectric material and the ink receiving material 22 if necessary. Likewise each ink cartridge may include inks having the same or unique electrical and physical properties to tailor the layering of the dielectric material. It is also possible that the ink receiving layer provide more function than just to receive the carrier fluid from a liquid based ink. This layer could be considered a compatibilizing layer to improve the integrity and adhesion between the layers in the stack of layers for resistance to wear during handling.

For purposes of the present invention, the dielectric material 22 may be any material operative to electrically insulate one conductive body from another conductive body or substantially reduce the efficiency of electrical transfer between bodies. Exemplary dielectric materials for use with the present invention include, without limitation, a polyester based toner, 10B041M (commercially available from Lexmark International, Inc.), and a styrene butyl acrylate toner, NR231A (commercially available from Lexmark International, Inc.).

It is also within the scope of the present invention that the toner include silicas or other materials that foster separation of the carrier fluid from the conductive particles disbursed therein. For instance, silicas may be added to dielectric toner deposited as a conductive receiving layer 22B to provide gaps within the layer sufficient to drain away the carrier fluid, but retain the conductive particles of the conductive ink within the vias 36, similar to the functionality provided by the channels 28 or pores within the Pictorico® paper. Alternatively, a silica layer is printed over the dielectric material 22A using an interface inkjet ink with silica particles. This silica layer may be printed over the dielectric material 22A, whether or not the dielectric material has been fused. In this instance, it is advantageous to incorporate a surfactant into the carrier fluid of the interface ink to provide a better bonding interface between the dielectric material and the silica particulates. Exemplary silicas for use within inkjet media include, without limitation, CAB-O-SPERSE® fumed silicas ( ), AEROSIL® fumed silicas and precipitated silicas ( ), SNOWTEX® colloidal silicas ( ), and SYLOJET® & SYLOID® silica gels (http://www.gracedavison.com/products/silgelap.htm).

As discussed previously, the toner comprising the dielectric material 22 is generally hydrophobic, which tends to bead the ink droplet and inhibit proper coverage of the conductive particles that are deposited directly on top of the toner. A principal reason for this hydrophobic property is the presence of waxes in the toner to help in fusing the toner. However, the waxes in the toner may be manipulated to generate a toner that is more or less hydrophobic. Exemplary waxes that may be incorporated into the dielectric toner to reduce hydrophobicity include, without limitation, Unilin, Unicid, Ceramer, and Unithox Unilin, available from Baker Petrolite (www.baker-hughes.com). Those of ordinary skill will readily understand that the particular formulation of toner chosen will depend on the various operating conditions and processing steps chosen to implement the instant invention.

Figure 6:
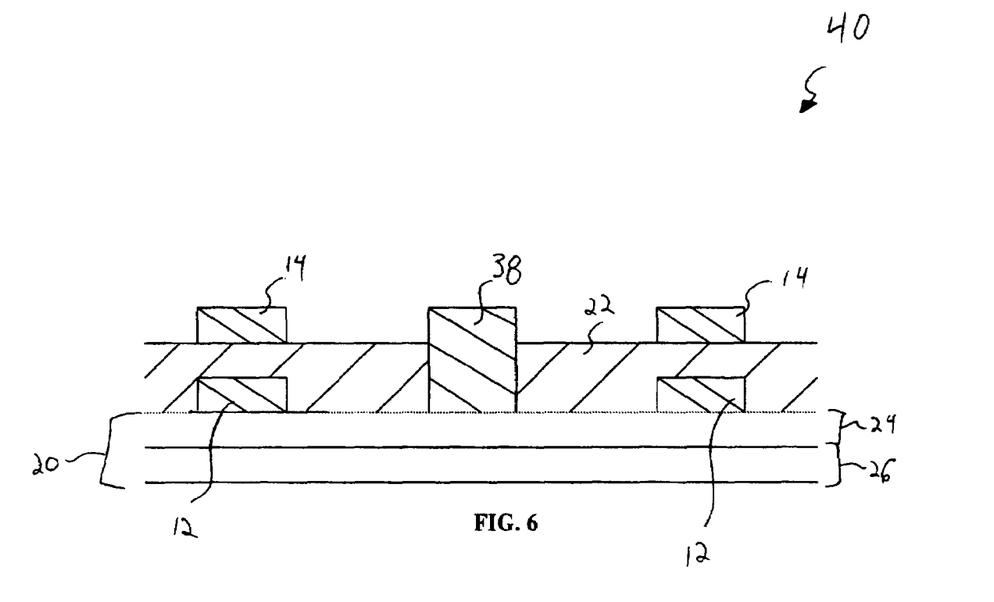
FIG. 6 is a cross-sectional view of a segment of a third exemplary printed circuit intermediate in accordance with the present invention.

Referring to FIG. 6, a third exemplary intermediate 40 of the present invention incorporates the second exemplary intermediate 34 and includes the deposition of conductive ink into the vias 36 to form the interconnection 38 and the conductive leads of the second conductive pathway 14. As discussed above for the first exemplary intermediate 30, the substrate and the material deposited thereon may be subjected to a vacuum and/or an elevated temperature environment to drive off the carrier fluid from the conductive particles during, or subsequent to, deposition. It should be understood that the deposition of conductive ink into the vias 36 may occur at a time different from the formation of the remainder of the second conductive pathway 14. In this manner, the carrier fluid deep within the via 36 may be drawn off to provide for settling of the conductive particles deposited prior to the deposition of the remainder of the second conductive pathway 14. However, it is not a requisite to deposit the conductive ink to form the interconnection 38 at a time separate from the formation of the bulk of the second conductive pathway 14.

Figure 7:
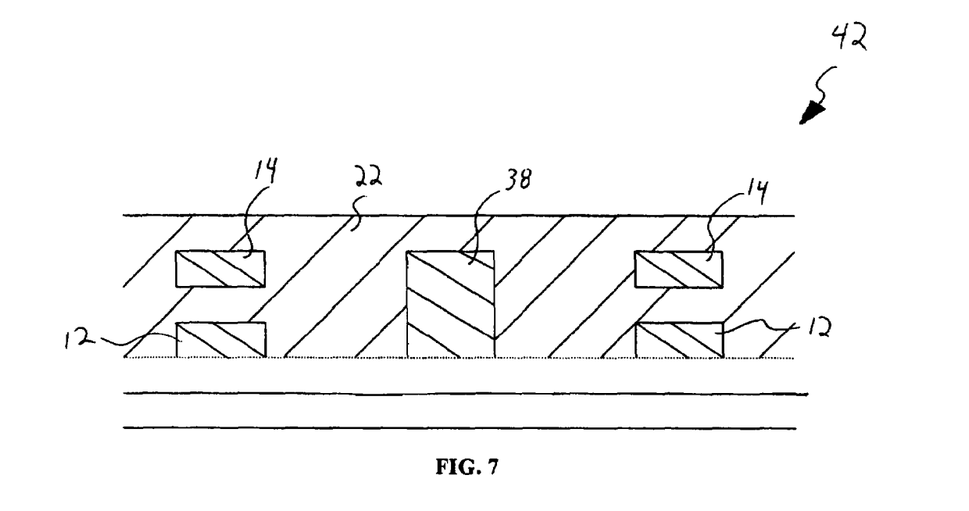
FIG. 7 is a cross-sectional view of a segment of a fourth exemplary printed circuit intermediate in accordance with the present invention.

Referring to FIG. 7, a fourth exemplary intermediate 42 of the present invention incorporates the third exemplary intermediate 40 and includes the deposition of dielectric material 22 to isolate selected portions of the second conductive pathway 14. As discussed above, the dielectric material 22 may be deposited in a continuous manner to form one or more discrete layers, or may be deposited sequentially to form one or more discrete layers. Likewise, the dielectric material 22 may be comprised of differing materials, such as more hydrophilic materials being deposited in regions where it is likely that conductive ink will come in contact with these materials, and more hydrophobic materials being deposited in regions where it is unlikely that conductive ink will come in direct contact with such materials. Also, the dielectric material 22 may be fused in a single process or sequentially fused.

Figure 8:
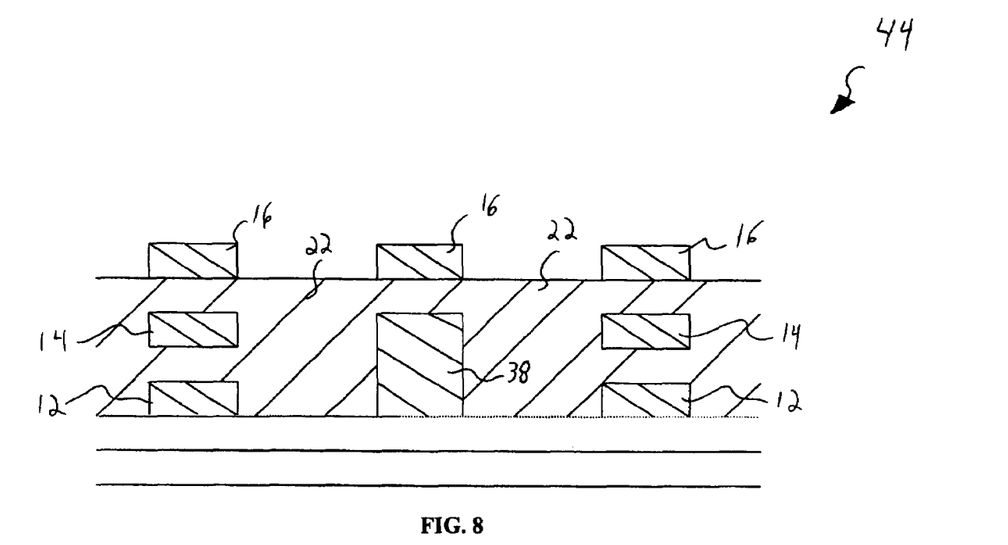
FIG. 8 is a cross-sectional view of a segment of a fifth exemplary printed circuit intermediate in accordance with the present invention.
Figure 9:
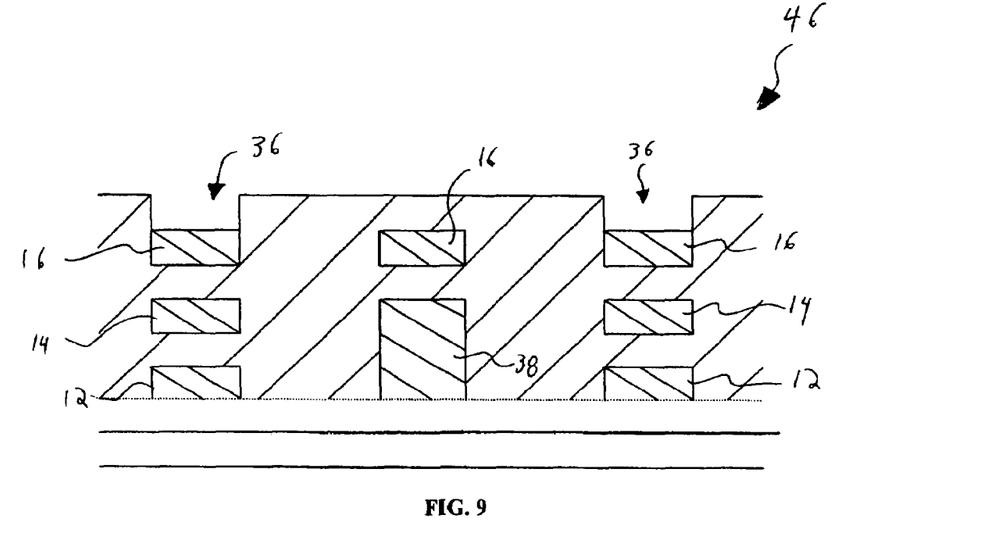
FIG. 9 is a cross-sectional view of a segment of a sixth exemplary printed circuit intermediate in accordance with the present invention.
Figure 10:
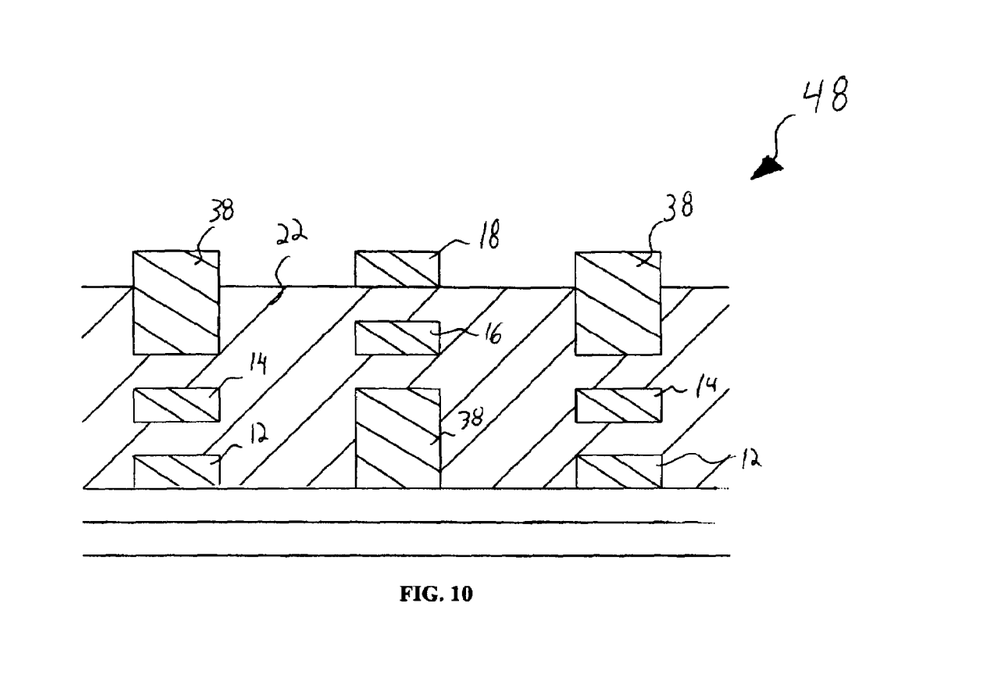
FIG. 10 is a cross-sectional view of a segment of a seventh exemplary printed circuit intermediate in accordance with the present invention.

Referring to FIGS. 8-10, a fifth, sixth, and seventh exemplary intermediates are shown 44, 46, 48. Each successive intermediate incorporates the structure of the directly preceding intermediate. As discussed above, conductive ink is deposited to form the third and fourth conductive pathways 16, 18, with dielectric material 22 being deposited in an interposed manner to insure only the interconnections 38 establish electrical contact between the vertically separated electrical pathways. In this manner, the formation of successive conductive pathways is easily accomplished. Thus, the invention is not limited to four conductive pathways and encompasses less than four pathways, four pathways, and greater than four pathways.

Figure 11:
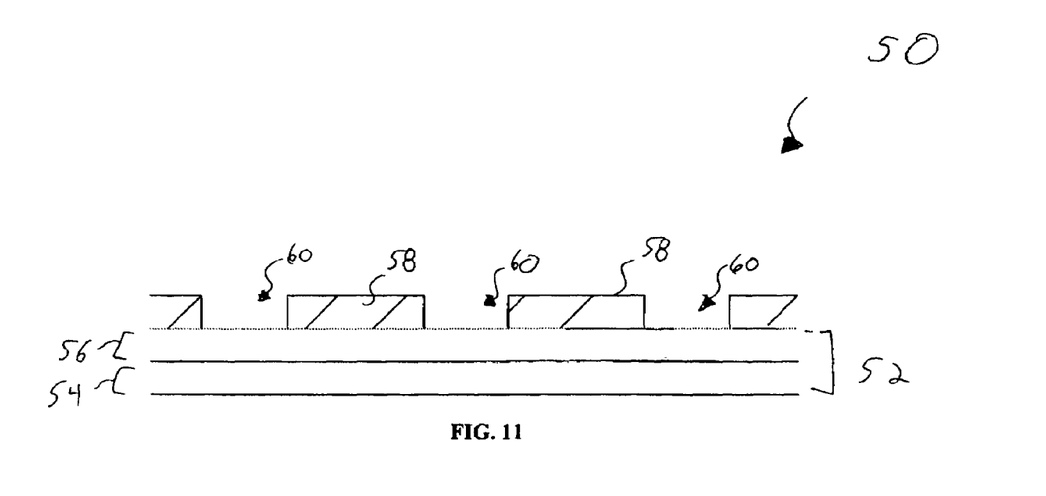
FIG. 11 is a cross-sectional view of a segment of a first alternate exemplary printed circuit intermediate in accordance with the present invention.

Referring to FIG. 11, a first alternate exemplary intermediate 50 includes a substrate 52 comprising a cellular-based backer 54 and a top layer of silicon or silicon dioxide particles 56. In contrast to the first exemplary intermediate 30, an inkjet printer (not shown) selectively deposits a layer of dielectric material 58 over the top layer of particles 56 in selected areas. The dielectric material 58 is comprised of dielectric particles disbursed throughout an inkjet carrier fluid so that when the ink is deposited onto the substrate 52, the carrier fluid is drawn away from the dielectric particles, thereby leaving dielectric particles that become stacked upon one another as subsequent deposition occurs at a given location. The stacking of dielectric particles in a given location eventually forms a layer that cooperates with the exposed area of the silica particles 56 to form vias 60. Exemplary dielectric inks for use with the present invention include, without limitation

| Two component dielectric ink formulation: | | |
|---|---|---|
| Ingredient | Example | Percentage |
| Blocked isocanate | Bayhydur ® VP LS 2310 | 8% |
| Polyol/Acrylic Acid | Joncryl ® 678 | 4% |
| Dispersant | JS1329A | 0.8% |
| Surfactant | Surfynol ® 465 | 1% |
| Co-solvent 1 | Propylene glycol | 10% |
| Co-solvent 2 | Poly(ethylene glycol) MW 200 | 5% |
| Balance D.I. Water | | |

| Two Separated One-component dielectric ink formulation, Isocyanate formulation | | |
|---|---|---|
| Ingredient | Example | Percentage |
| Blocked isocanate | Bayhydur ® VP LS 2310 | 10% |
| Dispersant | JS1329A | 0.8% |
| Surfactant | Surfynol ® 465 | 1% |
| Co-solvent 1 | Propylene glycol | 10% |
| Co-solvent 2 | Poly(ethylene glycol) MW 200 | 5% |
| Balance D.I. Water | | |

| Two Separated One-component dielectric ink formulation, Polyol/Acrylic acid formulation | | |
|---|---|---|
| Ingredient | Example | Percentage |
| Polyol/Acrylic Acid | Macrynal ® VSM 2521 | 5% |
| Dispersant | JS1329A | 0.8% |
| Surfactant | Surfynol ® 465 | 1% |
| Co-solvent 1 | Propylene glycol | 10% |
| Co-solvent 2 | Poly(ethylene glycol) MW 200 | 5% |
| Balance D.I. Water | | |

Where:
  Bayhydur ® VP LS 2310 is a product of Bayer Corp.;
  Joncryl 678 is a product of Johnson Polymer;
  Macrynal ® VSM 2521 is a product of UCB;
  Surfynol ® 465 is a product of Dow Air Products, Corp.; and
  JS1329A is a proprietary dispersant of Lexmark International, Inc., but could be substituted with a dispersant from the Joncryl family of dispersants available from SC Johnson.

Exemplary dielectric inks for use with the present invention may be formulated by combining two groups of compounds. The first group comprises compounds with functional groups capable of reacting with active hydrogen, such as an isocyanate group. The second group comprises compounds with functional groups containing active hydrogen, such as hydroxyl, amino, thiol, urethane, or urea groups (such as polyols or acrylic acids) or functional groups that can be converted into active hydrogen containing functional groups, such as carboxylic acid derivatives (such as anhydride groups).

The material selected from the second group may also act as a humectant. This is an advantage because humectants in the ink improve jetting reliability, however, the presence of these compounds/additives in the final film can adversely affect its physical, chemical, and electrical properties. Most notably, this can lead to higher water uptake than is tolerable in a dielectric material and the presence of non-volatile humectants on the surface of the film. Typically, these chemicals are removed by absorption in a substrate or evaporation during curing. If they can be reacted to form part of the cured film, then they are no longer detrimental to its properties.

Crosslinking material and crosslikable polymers can be formulated in one ink system or two separated ink systems. The ratios of both crosslinker and crosslikable materials in the exemplary formulations were calculated based on the equivalent weights necessary to achieve a 1:1 to 3:1 ratios of crosslinking-to-crosslinkable functional groups. A small amount of excess crosslinker was added to the ink formulation to react with humectant additives containing hydroxyl or active hydrogen groups. This improves the dielectric properties of the film. Crosslinking reaction will not occur without heating above the de-block temperature of the blocking agent of the blocked isocyanate. This is the property which allows both polyol and isocyanate groups to be present in a single formulation without reacting in the printhead before printing on the substrate. For one-ink system, both blocked polyisocyanate and polyols are added to the same ink. For two ink systems, blocked isocyanate and polyol are added into two separate ink formulations with the humectants, surfactants, and additives.

These dielectric inkjet inks may also include ceramic or metal oxide nano-particulates, such as, without limitation, titanium dioxide. Exemplary weight percentage ranges for these nano-particulates are between zero percent and twenty percent.

Figure 12:
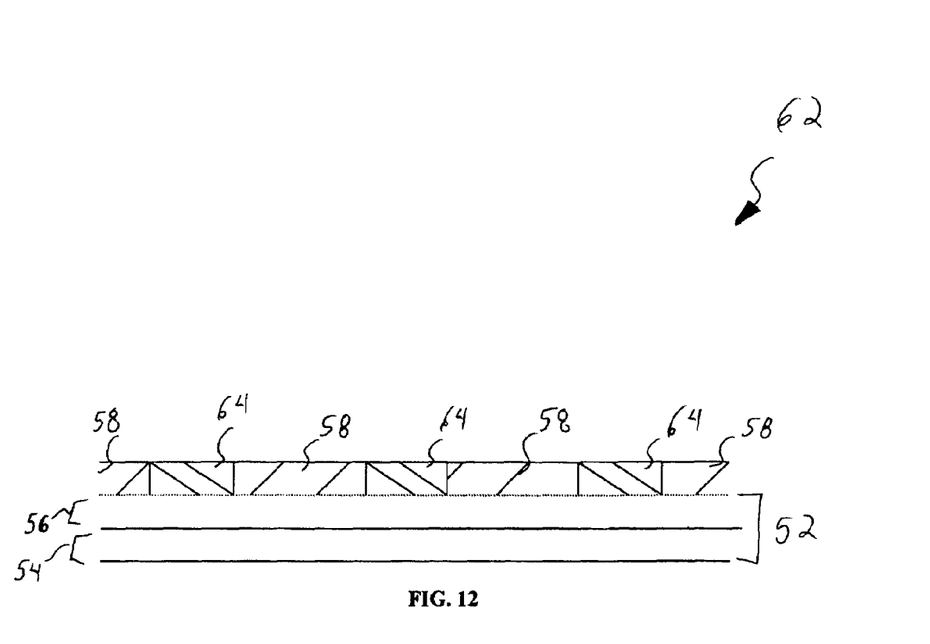
FIG. 12 is a cross-sectional view of a segment of a second alternate exemplary printed circuit intermediate in accordance with the present invention.

Referencing FIG. 12, a second alternate exemplary intermediate 62 includes a conductive material deposited in the vias 60 to form the first conductive path 64. In this exemplary embodiment, the conductive material is deposited onto the substrate 52 using a laser printer (not shown) having a toner cartridge with conductive particles. Exemplary toners having conductive particles distributed throughout the toner and can have particle sizes greater than five nanometers. Conductive particles sized less than five nanometers are likewise able to be distributed throughout the conductive toner and also fall within the scope of the invention. The conductive material comprising the first conductive path 64 may not necessarily be level with the surface of the surrounding dielectric material 58 subsequent to toner deposition. Where it is preferred that the first conductive path 64 be level with the surface of the surrounding dielectric material 58, a planarization process may be applied to the second alternate exemplary intermediate 62. Exemplary planarization processes include, without limitation, chemical mechanical planarization. It is also within the scope of the invention that the conductive toner be fused using the fusers of the laser printer.

Figure 13:
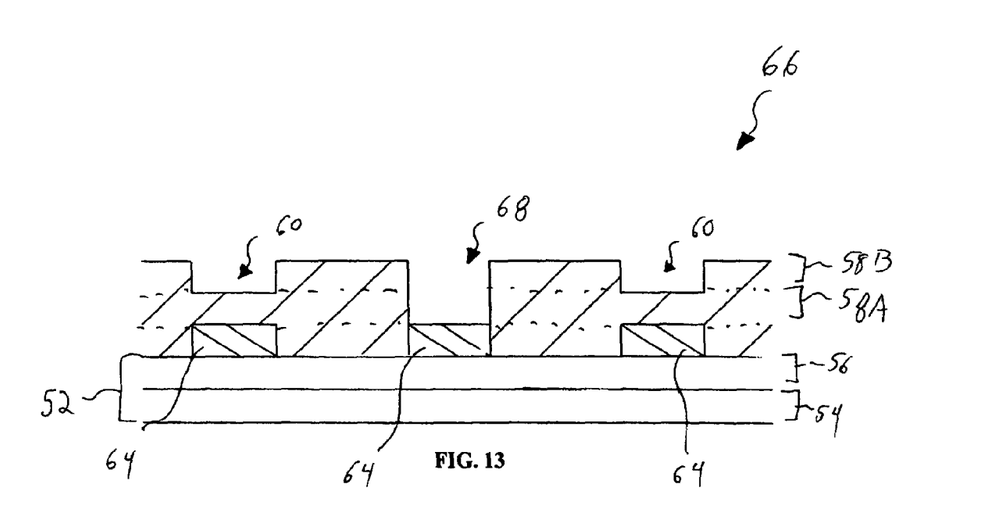
FIG. 13 is a cross-sectional view of a segment of a third alternate exemplary printed circuit intermediate in accordance with the present invention.

Referring to FIG. 13, a third alternate exemplary intermediate 66 incorporates the second alternate exemplary intermediate 62, and further includes a deposition of inkjet ink containing dielectric material 58 that builds upon the previously deposited dielectric material to selectively isolate portions of the first conductive path 64 from one another, while also retaining the exposure of certain portions of the first conductive path. The inkjet ink can be deposited in a continuous manner to form one or more discrete layers, or may be deposited sequentially to form one or more discrete layers. For example, a first dielectric layer 58A may be deposited to isolate adjacent conductive paths 64 from one another, but leaves exposed a portion of the first conductive path 64. Thereafter, a second dielectric layer 58B may be deposited to likewise retain the exposed portion of the first conductive path 64 to define an interconnection via 68, as well as cooperating with the underlying dielectric layer 58A to define vias 60 for a second conductive path 70. However, it should be understood that the dielectric layers 58A, 58B can actually comprise a single layer of dielectric material that is deposited sequentially in bulk form.

Figure 14:
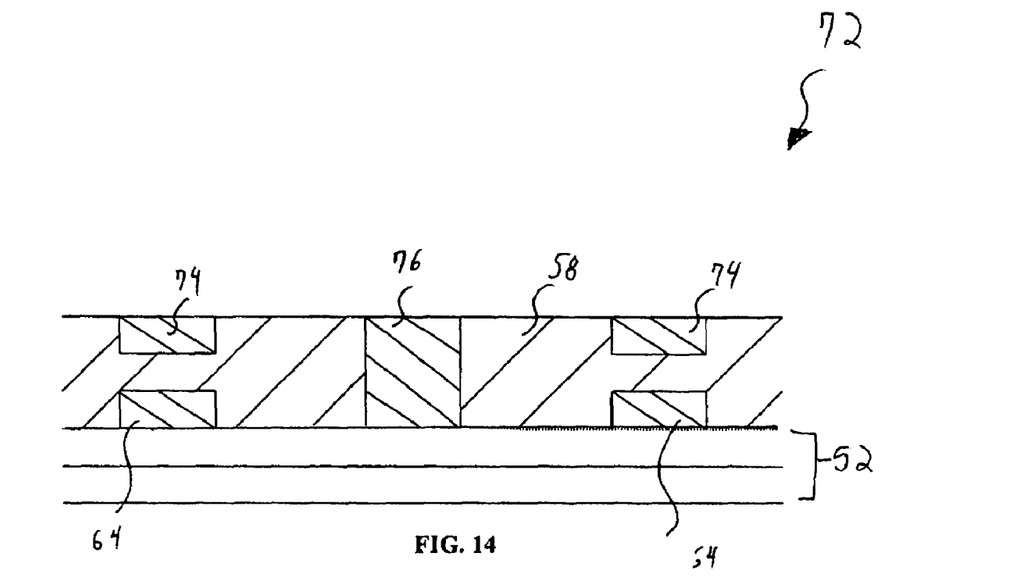
FIG. 14 is a cross-sectional view of a segment of a fourth alternate exemplary printed circuit intermediate in accordance with the present invention.
Figure 15:
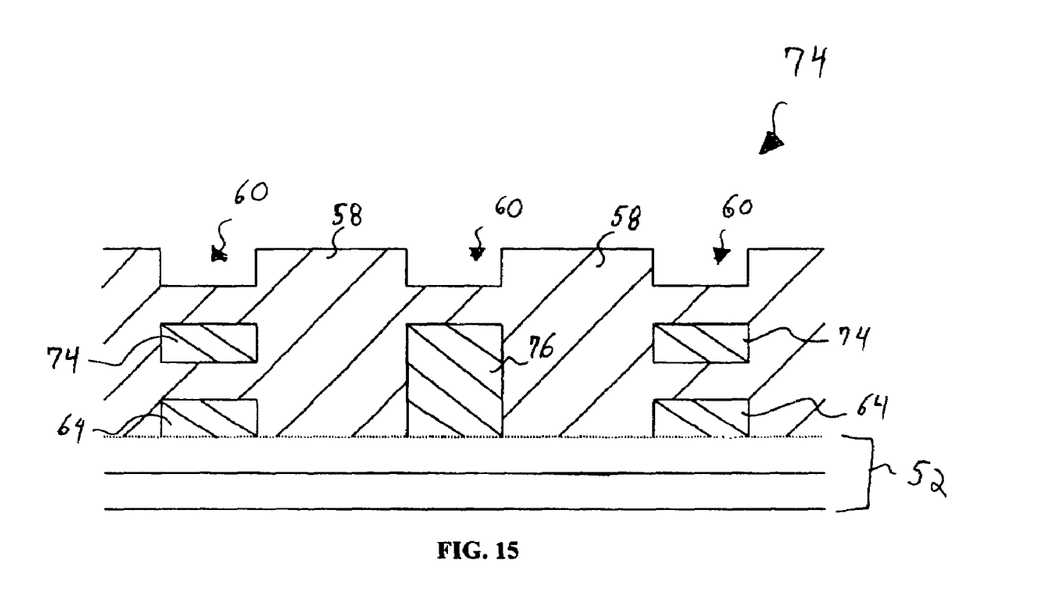
FIG. 15 is a cross-sectional view of a segment of a fifth alternate exemplary printed circuit intermediate in accordance with the present invention.
Figure 16:
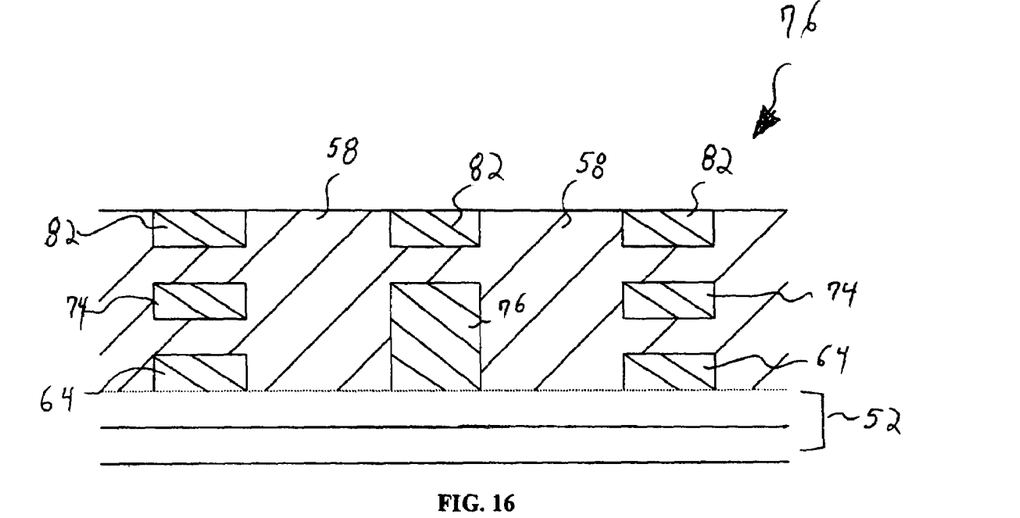
FIG. 16 is a cross-sectional view of a segment of a sixth alternate exemplary printed circuit intermediate in accordance with the present invention.
Figure 17:
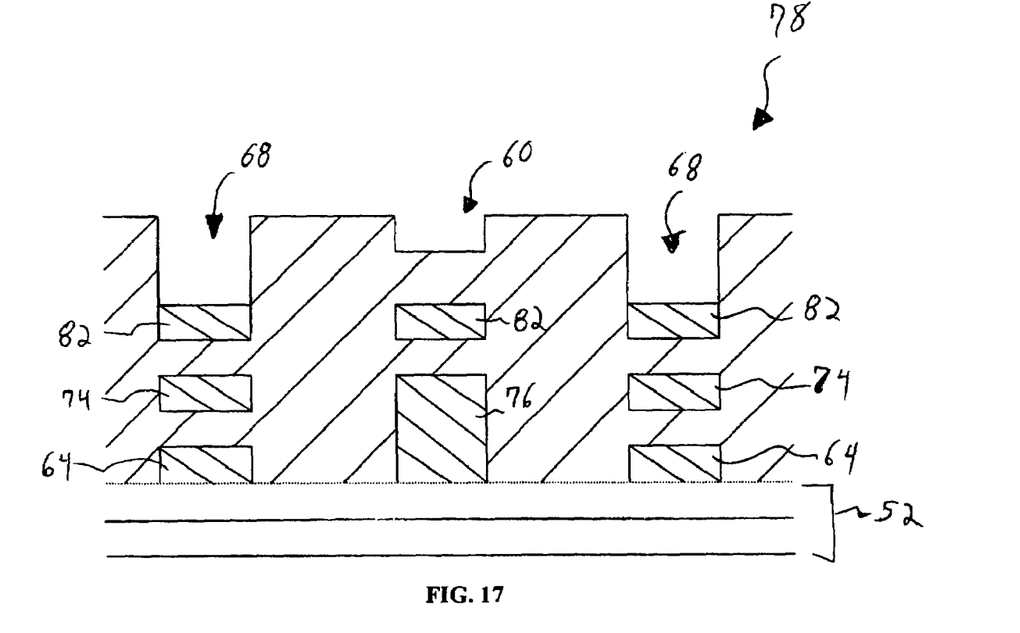
FIG. 17 is a cross-sectional view of a segment of a seventh alternate exemplary printed circuit intermediate in accordance with the present invention.

Referring to FIG. 14, a fourth alternate exemplary intermediate 72 incorporates the third alternate exemplary intermediate 66, and further includes a deposition of conductive toner comprising the second conductive path 74. The second conductive path 74, for purposes of explanation, includes the interconnection 76 that is operative to electrically bridge and vertically connect to the first conductive path 64. The conductive toner may be deposited in the interconnection via 68 prior to, concurrent with, or after the conductive toner is applied in the vias 60. Moreover, the conductive material comprising the second conductive path 74 may not necessarily be level with the surface of the surrounding dielectric material 58 after deposition. Again, where it is preferred that the second conductive path 74 be level with the surface of the surrounding dielectric material 58, a planarization process may be applied to the fourth alternate exemplary intermediate 72.

Figure 18:
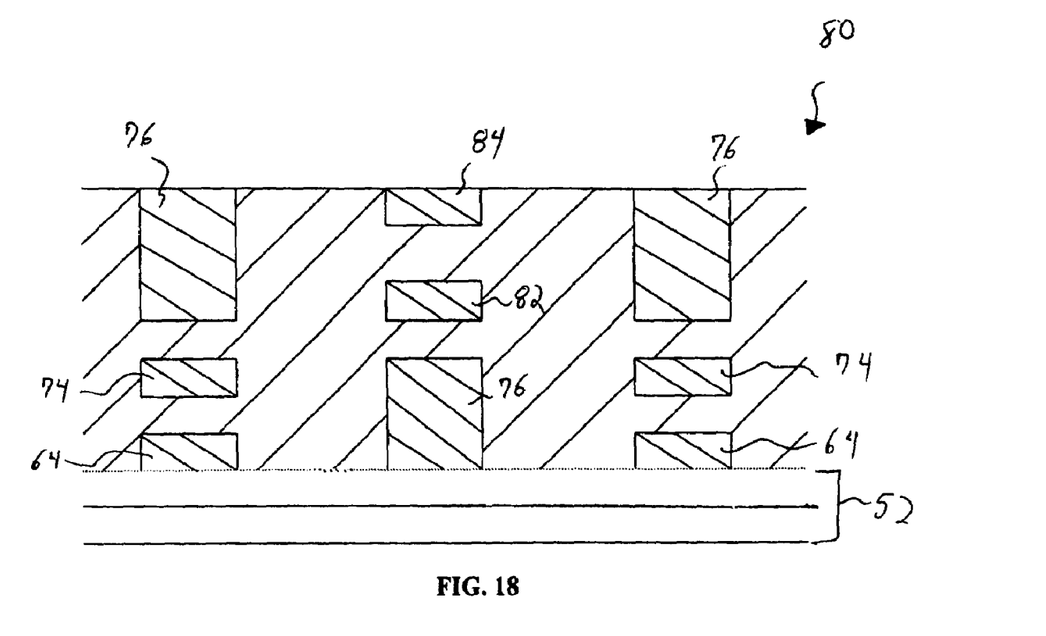
FIG. 18 is a cross-sectional view of a segment of an eighth alternate exemplary printed circuit intermediate in accordance with the present invention.

Referencing to FIGS. 15-18, a fifth, sixth, seventh, and eighth alternate exemplary intermediates 74, 76, 78, 80 are shown. The fifth alternate exemplary intermediate 74 includes deposited dielectric material to form vias 60 for a third conductive pathway 82, which is subsequently deposited to form the sixth alternate exemplary intermediate 76. Thereafter, dielectric material 58 is deposited to form the seventh alternate exemplary intermediate 78 that includes vias 60 and interconnection vias 68, which will be occupied by a subsequently deposited fourth conductive pathway 84, as shown in FIG. 18, comprising the eighth exemplary embodiment 80. A subsequent capping layer of dielectric may be applied to construct the exemplary circuit of FIG. 1, or refrain from further deposition of dielectric material to comprise an alternate exemplary circuit 80.

It is also within the scope of the present invention that a laser printer, for example, can be utilized to deposit the conductive material, the dielectric material and the ink receiving layer. Moreover, it is further within the scope of the present invention that an inkjet printer can be utilized to deposit the conductive material the dielectric material and the ink receiving layer. Likewise, multiple laser printers and/or multiple inkjet printers, for example, may be utilized to carry out one or more aspects of the present invention.

It is also within the scope of the invention to omit the interconnections, thereby forming conductive layers that are electrically isolated from one another. In this manner, multiple RFID antenna may be printed upon a single substrate. Moreover, the stacked structure of multiple RFID antennas may include interposed disposable layers to facilitate separation of the antennas subsequent to fabrication.

Finally, it is to be understood that the dimensions of the conductive pathways and interposed dielectric material are within the purview of one of ordinary skill and may be dependent upon the particular printed circuit application.

Following from the above description and invention summaries, it should be apparent to those of ordinary skill in the art that, while the methods and apparatuses herein described constitute exemplary embodiments of the present invention, the invention contained herein is not limited to this precise embodiment and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A method of fabricating a printed circuit comprising:
   depositing a first conductive material to form a first conductive pathway upon a substrate;
   depositing a dielectric material directly over at least a first portion of the conductive pathway utilizing an electrophotographic process;
   depositing a second conductive material over at least a portion of the dielectric material to form a second conductive pathway, where the second conductive pathway is in electrical communication with the first conductive pathway;
   wherein the act of depositing the dielectric material over at least the first portion of the conductive pathway includes selectively depositing the dielectric material to form at least one via leaving exposed a second portion of the first conductive pathway; and the act of depositing the second conductive material over at least a portion of the dielectric material to form the second conductive pathway upon the substrate includes utilizing an inkjet process to deposit the second conductive material.

2. The method of claim 1, wherein:

the act of depositing the first conductive material to form the first conductive pathway upon the substrate includes utilization of a first set of inkjet nozzles to deposit the first conductive material; and the act of depositing the second conductive material over at least a portion of the dielectric material to form the second conductive pathway upon the substrate includes utilization of a second set of inkjet nozzles to deposit the second conductive material.

3. The method of claim 1, wherein the act of depositing the dielectric material over at least the first portion of the conductive pathway utilizing the electrophotographic process includes:

depositing the dielectric material to form a first dielectric layer over at least the first portion of the first conductive pathway; and depositing the dielectric material over the first dielectric layer to form a second dielectric layer that at least partially defines a trench into which the second conductive material forming the second conductive pathway is deposited;

wherein the acts of depositing the first dielectric layer and the second dielectric layer create a via enabling electrical communication between the first conductive pathway and the second conductive pathway.

4. The method of claim 3, wherein:

the act of depositing the dielectric material to form the first dielectric layer includes utilizing toner from a first toner cartridge of a laser printer;

the act of depositing the dielectric material to form the second dielectric layer includes utilizing toner from a second toner cartridge of the laser printer.

5. The method of claim 4, wherein the act of depositing the first layer and second layer of the dielectric material are deposited in a single pass.

6. The method of claim 3, wherein the act of depositing the second conductive material to form the second conductive pathway upon the substrate includes depositing the second conductive material within the via and within the trench.

7. The method of claim 1, further comprising the acts of:

curing the first conductive material deposited upon the substrate prior to the act of depositing the dielectric material over at least the first portion of the first conductive material; and curing the second conductive material deposited over the dielectric material prior to the act of depositing the conductive material over at least the portion of the dielectric material.

8. The method of claim 1, wherein the substrate is at least one of silicon-based, polymer-based, lingo-cellulose-based, and glass.

9. The method of claim 1, further comprising the act of subjecting at least one of the first conductive material, the dielectric material, and the second conductive material to a vacuum.

10. The method of claim 1, further comprising the act of subjecting at least one of the first conductive material, the dielectric material, and the second conductive material to an elevated temperature environment.

11. A method of fabricating a printed circuit comprising:

depositing a conductive material to form a first conductive pathway upon a substrate;

depositing a dielectric material in contact with at least a first portion of the first conductive pathway;

depositing a conductive material directly over the dielectric material to form a second conductive pathway in a stacked structure;

wherein the act of depositing the dielectric material in contact with at least a first portion of the first conductive pathway includes the act of vertically electrically insulating the first portion of the conductive pathway from the second conductive pathway;

the act of depositing the conductive material to form the first conductive pathway upon the substrate includes utilization of a first set of inkjet nozzles to deposit the first conductive pathway upon the substrate; and the act of depositing the conductive material to form the second conductive pathway upon the substrate includes utilization of a second set of inkjet nozzles to deposit the second conductive pathway upon the substrate.

12. The method of claim 11, wherein:

the act of depositing the dielectric material in contact with at least the first portion of the conductive pathway includes utilizing an electrophotographic process to deposit the dielectric material to form at least one via; and the act of depositing the conductive material to form the second conductive pathway upon the substrate includes utilizing an inkjet process to deposit the conductive material within at least one via.

13. The method of claim 11, wherein the act of depositing the dielectric material in contact with at least the first portion of the conductive pathway utilizing an electrophotographic process includes:

depositing the dielectric material to form a first layer in contact with at least the first portion of the conductive pathway; and depositing the dielectric material to form a second layer in contact with the first layer of dielectric material layer to define vias.

14. The method of claim 13, wherein:

the act of depositing the dielectric material to form the first layer includes utilizing toner from a first toner cartridge of a laser printer;

the act of depositing the dielectric material to form the second layer includes utilizing toner from a second toner cartridge of the laser printer.

15. The method of claim 14, wherein:

the act of depositing the first layer and second layer of the dielectric material are deposited in a single pass.

16. The method of claim 13, wherein the act of depositing the conductive material to form the second conductive pathway upon the substrate to provide the stacked structure includes depositing the conductive material within the vias to provide the stacked structure.

* * * * *

UNITED STATES PATENT AND TRADEMARK OFFICE
CERTIFICATE OF CORRECTION

PATENT NO. : 7,615,704 B2  Page 1 of 1
APPLICATION NO. : 11/305828
DATED : November 10, 2009
INVENTOR(S) : Rebecca Silveston-Keith It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 917 days.

Signed and Sealed this

Nineteenth Day of October, 2010

David J. Kappos
*Director of the United States Patent and Trademark Office*